United States Patent
Ogo et al.

(10) Patent No.: US 12,103,570 B2
(45) Date of Patent: Oct. 1, 2024

(54) TRAVELING VEHICLE SYSTEM

(71) Applicant: MURATA MACHINERY, LTD., Kyoto (JP)

(72) Inventors: Haruki Ogo, Inuyama (JP); Kazuhiro Ishikawa, Inuyama (JP); Yasuhisa Ito, Ise (JP); Masayoshi Torazawa, Inuyama (JP)

(73) Assignee: MURATA MACHINERY, LTD., Kyoto (JP)

( * ) Notice: Subject to any disclaimer, the term of this patent is extended or adjusted under 35 U.S.C. 154(b) by 783 days.

(21) Appl. No.: 17/297,508

(22) PCT Filed: Oct. 23, 2019

(86) PCT No.: PCT/JP2019/041503
§ 371 (c)(1),
(2) Date: May 27, 2021

(87) PCT Pub. No.: WO2020/110522
PCT Pub. Date: Jun. 4, 2020

(65) Prior Publication Data
US 2022/0032971 A1 Feb. 3, 2022

(30) Foreign Application Priority Data
Nov. 28, 2018 (JP) ................ 2018-222552

(51) Int. Cl.
*B61B 3/02* (2006.01)
*B65G 1/04* (2006.01)
(Continued)

(52) U.S. Cl.
CPC .............. *B61B 3/02* (2013.01); *B65G 1/0457* (2013.01); *B66C 7/02* (2013.01);
(Continued)

(58) Field of Classification Search
CPC .. B61B 3/00; B61B 3/02; B61B 13/02; B61B 13/00; B65G 1/00; B65G 1/0457;
(Continued)

(56) References Cited

U.S. PATENT DOCUMENTS

| 8,701,864 B2 * | 4/2014 | Ogawa ................ B66B 3/00 |
| | | 198/465.4 |
| 2004/0107862 A1 | 6/2004 | Suh |

(Continued)

FOREIGN PATENT DOCUMENTS

| KR | 10-2015-0045157 A | 4/2015 |
| TW | 201833018 A | 9/2018 |
| WO | 2018/037762 A1 | 3/2018 |

OTHER PUBLICATIONS

Official Communication issued in corresponding Taiwanese Patent Application No. 108142071, mailed on Nov. 30, 2022.

(Continued)

*Primary Examiner* — Zachary L Kuhfuss
*Assistant Examiner* — Heaven R Buffington
(74) *Attorney, Agent, or Firm* — Keating & Bennett, LLP

(57) ABSTRACT

A traveling vehicle system includes a track and a ceiling traveling vehicle. The track includes a first track, a second track, and a connection track. The ceiling traveling vehicle includes a direction changer that turns a coupler, which couples a traveling wheel and a main body to each other and passes through a gap between the first track or the second track and the connection track. A guider is provided in the coupler, moves along a first guide surface in a first state in which the traveling wheel rolls on the first track, and moves along a second guide surface in a second state in which the traveling wheel rolls on the second track.

5 Claims, 12 Drawing Sheets

(51) Int. Cl.
*B66C 7/02* (2006.01)
*H01L 21/677* (2006.01)

(52) U.S. Cl.
CPC .... *H01L 21/67715* (2013.01); *H01L 21/6773* (2013.01); *H01L 21/67733* (2013.01); *B65G 2201/0297* (2013.01)

(58) Field of Classification Search
CPC ..... B65G 2201/0297; B66C 7/00; B66C 7/02; B66C 7/04; B66C 7/12; B66C 17/06; H01L 21/677; H01L 21/67703; H01L 21/67706; H01L 21/67715; H01L 21/6773; H01L 21/67733
USPC .......... 104/89, 91, 94, 96, 98; 105/155, 156, 105/163.1
See application file for complete search history.

(56) References Cited

U.S. PATENT DOCUMENTS

2016/0272468 A1  9/2016  Izumi
2019/0189488 A1  6/2019  Ito

OTHER PUBLICATIONS

Official Communication issued in International Patent Application No. PCT/JP2019/041503, mailed on Dec. 17, 2019.
Official Communication issued in corresponding European Patent Application No. 19888268.0, mailed on Jul. 6, 2022.

\* cited by examiner

TRAVELING VEHICLE SYSTEM

BACKGROUND OF THE INVENTION

1. Field of the Invention

The present invention relates to a traveling vehicle system.

2. Description of the Related Art

In semiconductor manufacturing factories or the like, a traveling vehicle system conveying articles such as front opening unified pods (FOUPs) housing semiconductor wafers and reticle pods housing reticles by traveling vehicles is used, for example. As this type of traveling vehicle system, a configuration is known to include a track including a first track extending along a first direction, a second track extending along a second direction different from the first direction, and a connection track connecting the first track and the second track to each other, a traveling wheel rolling on the track, a main body located below the track, a coupler coupling the traveling wheel and the main body to each other, and a direction changer integrally rotating the traveling wheel and the coupler (refer to International Publication No. WO2018/037762, for example).

In the traveling vehicle system described in International Publication No. WO2018/037762, it is necessary that both when the traveling vehicle travels along the first track and when the traveling vehicle travels along the second track, the main body be not positionally deviated in a direction crossing its traveling direction. Consequently, a configuration is considered in which a guide roller or the like is located in the traveling vehicle, and this guide roller rolls on a guide surface provided along the track, whereby the positional deviation of the main body is prevented. However, the traveling vehicle in which the traveling wheel changes directions between during traveling along the first track and during traveling along the second track as in the above causes a problem in that when a mechanism to change the direction of the guide roller in accordance with the direction change of the traveling wheel is separately provided, the configuration of the traveling vehicle becomes complicated. In addition, an increase in the height dimension of the traveling vehicle by placement of the guide roller causes space efficiency near a ceiling of a building or the like in which the traveling vehicle system is installed to reduce.

SUMMARY OF THE INVENTION

Preferred embodiments of the present invention provide traveling vehicle systems each capable of preventing positional deviations of a main body of a traveling vehicle with a simple configuration while preventing complication of the traveling vehicle.

A traveling vehicle system according to a preferred embodiment of the present invention is a traveling vehicle system including a track including a first track extending along a first direction, a second track extending along a second direction different from the first direction, and a connection track adjacent to the first track in the first direction, adjacent to the second track in the second direction, and positioned with a gap with respect to each of the first track and the second track and a ceiling traveling vehicle traveling along the track, the track including a first guide surface provided along the first track and a second guide surface provided along the second track, and the ceiling traveling vehicle including a traveling wheel rolling on the first track, on the second track, and on the connection track, a main body located below the track, a coupler coupling a wheel shaft of the traveling wheel and the main body to each other and passing through the gap when the traveling wheel rolls on the connection track, a direction changer switching between a first state in which the traveling wheel rolls on the first track, and a second state in which the traveling wheel rolls on the second track, by turning the coupler about a turning axis with respect to the main body, and a guider provided in the coupler, moving along the first guide surface in the first state, and moving along the second guide surface in the second state.

The first guide surface may be a side surface of the first track, and the second guide surface may be a side surface of the second track. The guider may be located at a height between the wheel shaft of the traveling wheel and the main body, and the first guide surface and the second guide surface may be located at a height between the wheel shaft of the traveling wheel and the main body. The guider may include a guide roller that is able to roll when contacting the first guide surface or the second guide surface.

The connection track may include a first connection guide surface provided at the same or substantially the same height and in the same or substantially the same direction as the first guide surface and a second connection guide surface provided at the same or substantially the same height and in the same or substantially the same direction as the second guide surface. The connection track may include a continuous surface with the first connection guide surface and the second connection guide surface being continuous with each other. The continuous surface may be a curved surface smoothly connecting the first connection guide surface and the second connection guide surface to each other. The main body may be rectangular or substantially rectangular when viewed in an axial direction of the turning axis of the coupler and include the traveling wheel, the coupler, the direction changer, and the guider at each of four corner portions. A spacing between two guiders provided in a traveling direction of the ceiling traveling vehicle may be different from a spacing between two gaps adjacent to each other in the first direction or the second direction.

With the traveling vehicle system described above, the guider turns integrally with the coupler, and thus without any separate structure to change the direction of the guider, the direction of the guider is able to be switched in accordance with the direction change of the traveling wheel. Accordingly, the positional deviation of the main body is able to be prevented with a simple implementation while preventing the features and structure of the traveling vehicle from being complicated.

In the example preferred embodiment in which the first guide surface is a side surface of the first track, and the second guide surface is a side surface of the second track, the side surfaces of the first track and the second track are provided as the first guide surface and the second guide surface, respectively, and thus a portion of the tracks is able to define and function as the guide surfaces of the guider. In the example preferred embodiment in which the guider is located at a height between the wheel shaft of the traveling wheel and the main body, and the first guide surface and the second guide surface are located at a height between the wheel shaft of the traveling wheel and the main body, the dimension of the traveling vehicle in an up-and-down direction is prevented from increasing, and space efficiency near a ceiling of a building or the like in which the traveling vehicle system is installed is able to be prevented from being reduced. When the guider includes a guide roller that is able to roll when contacting the first guide surface or the second guide surface, frictional resistance when the guider comes into contact with the first guide surface or the second guide surface is able to be reduced.

In the example preferred embodiment in which the connection track includes a first connection guide surface provided at the same or substantially the same height and in the same or substantially the same direction as the first guide surface and a second connection guide surface provided at the same or substantially the same height and in the same or substantially the same direction as the second guide surface, the guider is in contact with the first connection guide surface or the second guide surface even in the connection track, and thus the positional deviation of the main body is able to be prevented. In the example preferred embodiment in which the connection track includes a continuous surface with the first connection guide surface and the second connection guide surface being continuous with each other, when the traveling wheel is turned by the direction changer, the guider is moved along the continuous surface, and thus the positional deviation of the main body during the turning of the traveling wheel is able to be prevented. In the implementation in which the continuous surface is a curved surface smoothly connecting the first connection guide surface and the second connection guide surface to each other, smooth movement of the guider on the continuous surface is able to be provided. In the example preferred embodiment in which the main body is rectangular or substantially rectangular when viewed in an axial direction of the turning axis of the coupler and has the traveling wheel, the coupler, the direction changer, and the guider at each of four corner portions, the positional deviation of the main body about a perpendicular axis with respect to the track is able to be prevented by guiders located at the four respective corner portions of the main body. In the example preferred embodiment in which a spacing between two guiders provided in a traveling direction of the ceiling traveling vehicle is different from a spacing between two gaps adjacent to each other in the first direction or the second direction, the two guiders provided in the traveling direction are able to be prevented from being simultaneously positioned at the gaps.

The above and other elements, features, steps, characteristics, and advantages of the present invention will become more apparent from the following detailed description of the preferred embodiments with reference to the attached drawings.

DETAILED DESCRIPTION OF THE PREFERRED EMBODIMENTS

Figure 1:
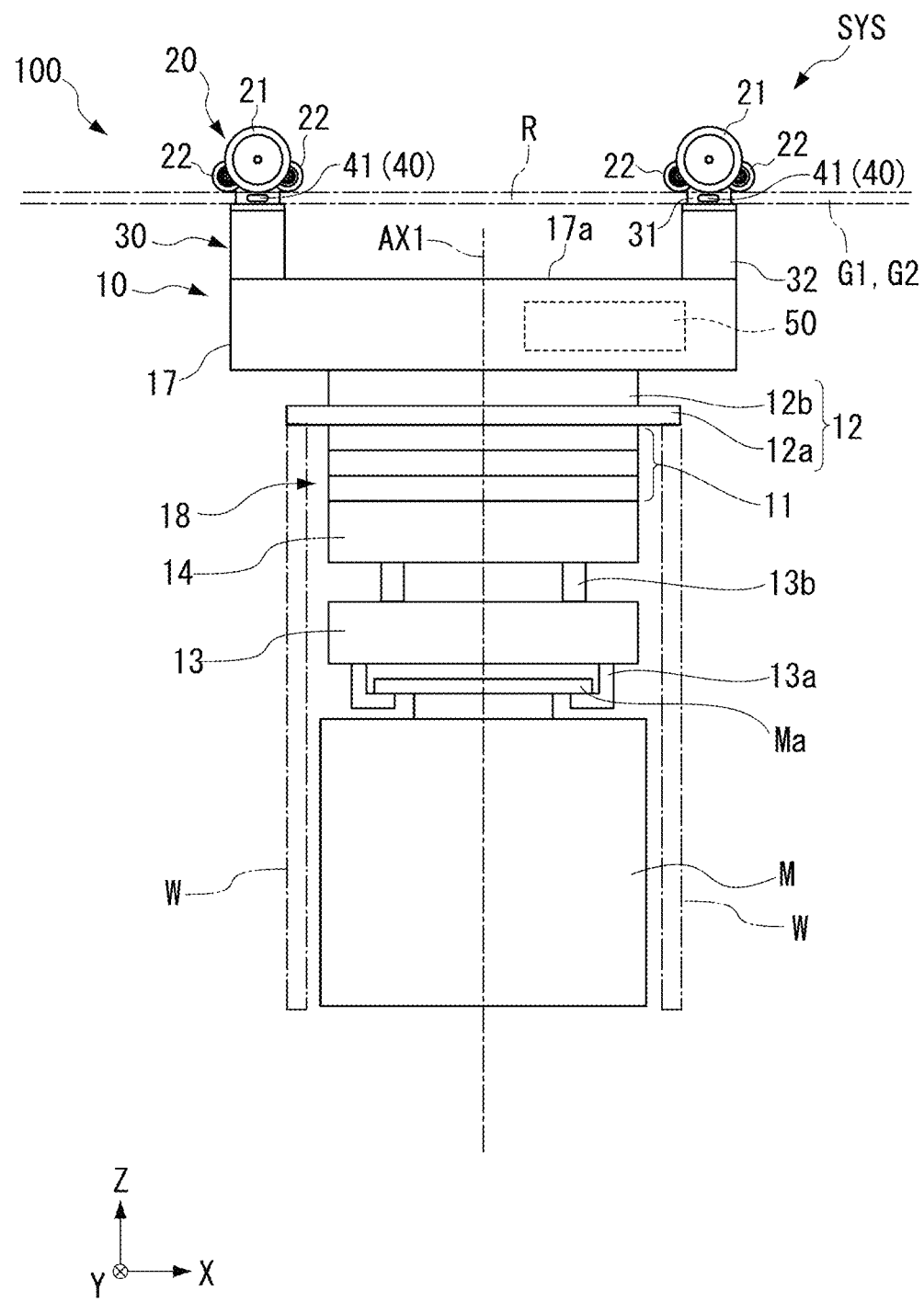
FIG. 1 is a side view illustrating an example of a traveling vehicle system according to a preferred embodiment of the present invention.

The following describes preferred embodiments of the present invention with reference to the accompanying drawings. However, the present invention is not limited to the features described herein. To describe the preferred embodiments, the drawings are represented with the scale changed as appropriate, for example, with partially enlarged or emphasized features. In the drawings below, directions in the drawings are described with respect to an XYZ coordinate system. In this XYZ coordinate system, a plane parallel to a horizontal plane is defined as an XY plane. One direction along this XY plane is denoted by an X direction, and a direction orthogonal to the X direction is denoted by a Y direction. A traveling direction of a ceiling traveling vehicle 100 is able to be changed to another direction from the direction illustrated in the drawings below; the ceiling traveling vehicle 100 may travel in a curved direction, for example. A direction perpendicular to the XY plane is denoted by a Z direction. Each of the X direction, the Y direction, and the Z direction is described with the direction shown by the arrow in the drawings as a +direction and with the direction opposite to the direction shown by the arrow as a −direction. A turning direction about a perpendicular axis or about a Z axis is denoted by a θZ direction.

Figure 2:
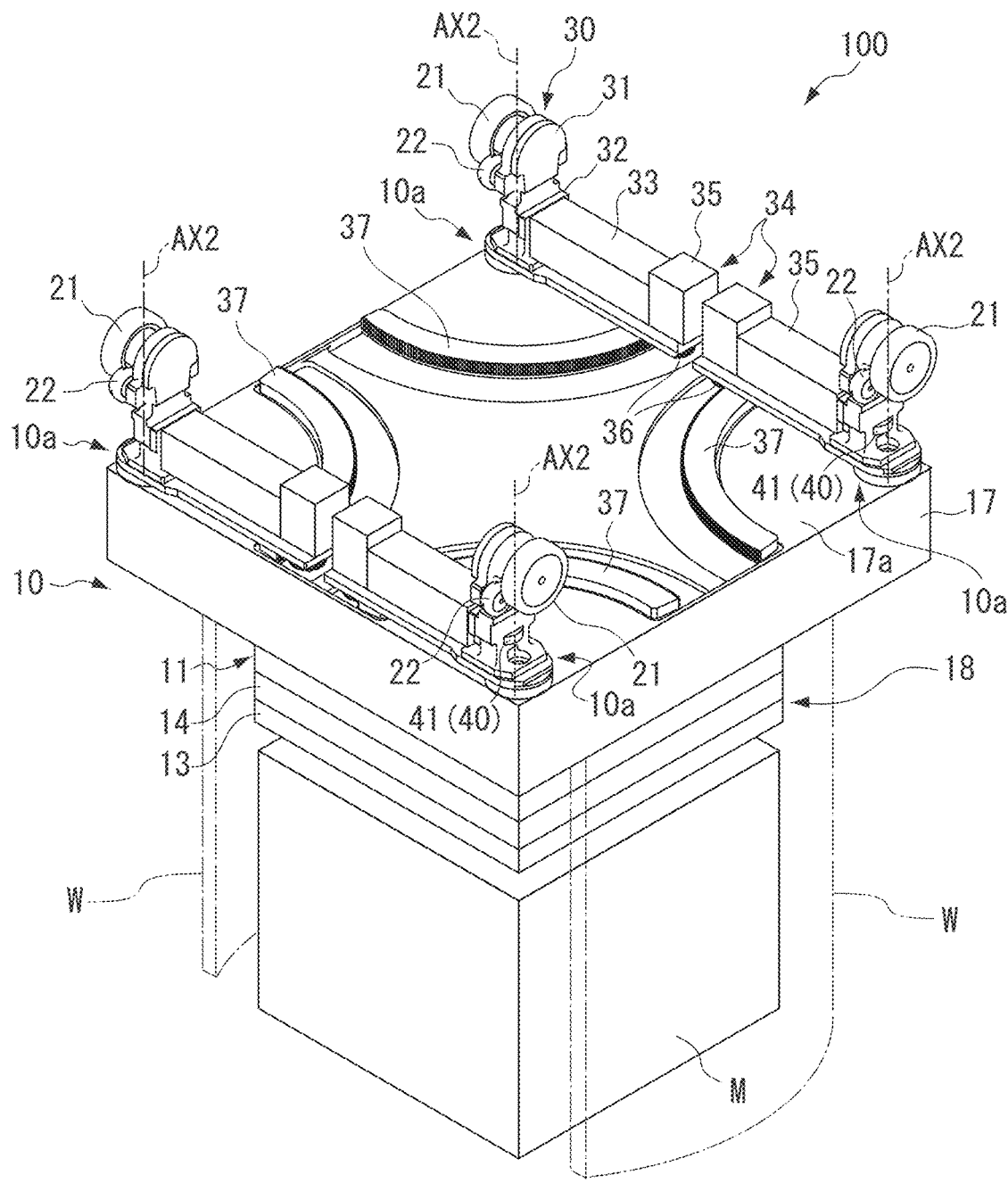
FIG. 2 is a perspective view of a ceiling traveling vehicle included in the traveling vehicle system according to the present preferred embodiment of the present invention.
Figure 3:
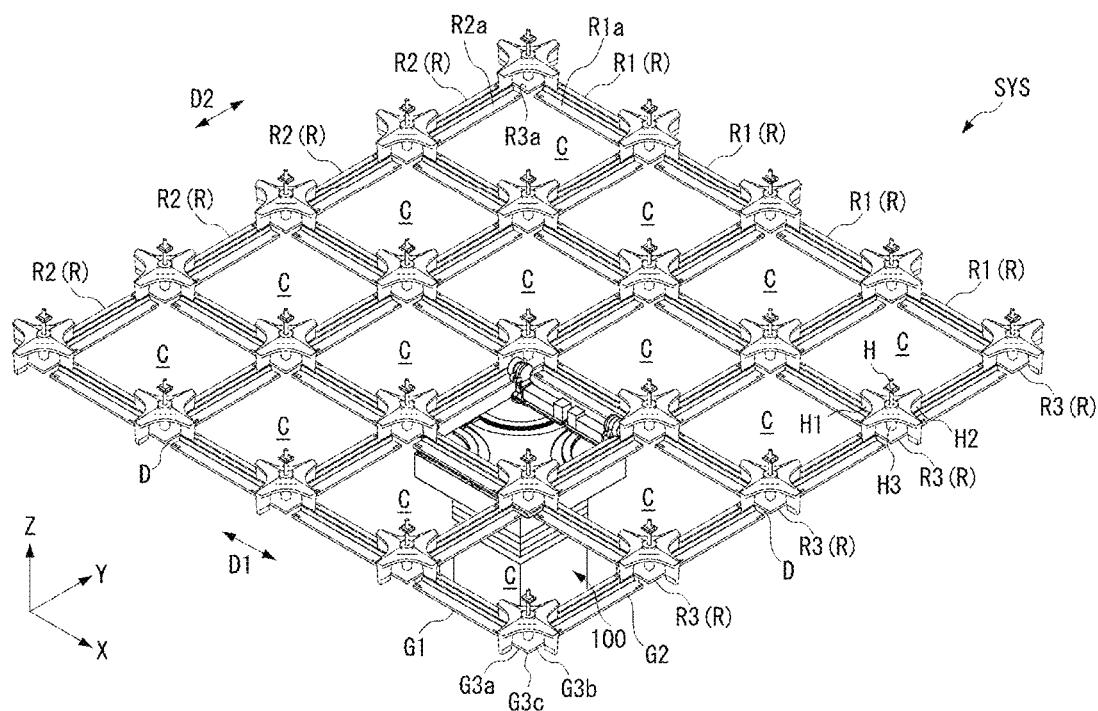
FIG. 3 is a perspective view illustrating an example of the traveling vehicle system according to the present preferred embodiment of the present invention.

FIG. 1 is a side view illustrating an example of a traveling vehicle system SYS according to the present preferred embodiment. FIG. 2 is a perspective view of the ceiling traveling vehicle 100 included in the traveling vehicle system SYS illustrated in FIG. 1. FIG. 3 is a perspective view illustrating an example of the traveling vehicle system SYS according to the present preferred embodiment. As illustrated in FIG. 1 to FIG. 3, the ceiling traveling vehicle 100 moves along a track R of the traveling vehicle system SYS to convey an article M, for example, a front opening unified pod (FOUP) housing semiconductor wafers or a reticle pod housing reticles. The ceiling traveling vehicle 100 conveys the article M and may thus be referred to as a ceiling conveyance vehicle.

The traveling vehicle system SYS is a system to convey the article M by the ceiling traveling vehicle 100 in a clean room of a semiconductor manufacturing factory, for example. In the traveling vehicle system SYS, a plurality of ceiling traveling vehicles 100 may be included, for example. The ceiling traveling vehicles 100 convey the article M to thus provide high-density conveyance and a significant improvement in the conveyance efficiency of the article M.

The track R is one aspect of a track. The track R is laid on the ceiling or near the ceiling of a building, for example, a clean room. The track R is a track with a grid shape including a first track R1, a second track R2, and a connection track R3 (refer to FIG. 3). The first track R1 is provided along the X direction (a first direction D1). The second track R2 is provided along the Y direction (a second direction D2). In the present preferred embodiment, the first direction D1 and the second direction D2 are orthogonal or substantially orthogonal to each other, and a plurality of first tracks R1 and a plurality of second tracks R2 are orthogonal or substantially orthogonal to each other. The connection track R3 is located at a crossing portion of the first track R1 and the second track R2. The connection track R3 is adjacent to the first track R1 in the first direction D1 and is adjacent to the second track R2 in the second direction D2. The connection track R3 connects the first track R1 and the second track R2 to each other. The first tracks R1 and the second tracks R2 are orthogonal or substantially orthogonal to each other, and thus, the track R is in a state in which a plurality of cells C are adjacent to each other in a plan view. FIG. 3 illustrates a portion of the track R, and in the track R, a similar implementation is continuously provided in the first direction D1 (the X direction) and the second direction D2 (the Y direction) from the implementation shown in FIG. 3.

The first track R1, the second track R2, and the connection track R3 are hung from the ceiling (not illustrated) by a hanging structure H (refer to FIG. 3). The hanging structure H includes a first portion H1 to hang the first track R1, a second portion H2 to hang the second track R2, and a third portion H3 to hang the connection track R3. First portions H1 and second portions H2 are each provided at two places across the third portion H3.

The first track R1, the second track R2, and the connection track R3 have traveling surfaces R1a, R2a, and R3a, respectively, on which a traveling wheel 21 described below of the ceiling traveling vehicle 100 travels. A gap D is provided between the first track R1 and the connection track R3 and between the second track R2 and the connection track R3. The gap D is a portion through which a coupler 30 described below as a portion of the ceiling traveling vehicle 100 passes when the ceiling traveling vehicle 100 travels along the first track R1 to cross the second track R2 or when the ceiling traveling vehicle 100 travels along the second track R2 to cross the first track R1. Accordingly, the gap D is provided in a width through which the coupler 30 is able to pass. The first track R1, the second track R2, and the connection track R3 are provided along the same or substantially the same horizontal plane. In the present preferred embodiment, the first track R1, the second track R2, and the connection track R3 place the traveling surfaces R1a, R2a, and R3a on the same or substantially the same horizontal plane.

The track R includes a first guide surface G1 and a second guide surface G2. The first guide surface G1 is provided along the first track R1. In the present preferred embodiment, the first guide surface G1 is provided on a side surface of the first track R1. The second guide surface G2 is provided along the second track R2. In the present preferred embodiment, the second track R2 is provided on a side surface of the second guide surface G2.

The connection track R3 includes a first connection guide surface G3a, a second connection guide surface G3b, and a continuous surface G3c. In the present preferred embodiment, the first connection guide surface G3a is provided at the same height (including substantially the same height) and in the same direction (including substantially the same direction) the first guide surface G1. That is, the first connection guide surface G3a and the first guide surface G1 are included in the same plane (including substantially the same plane). The second connection guide surface G3b is provided at the same height (including substantially the same height) and in the same direction (including substantially the same direction) as the second guide surface G2. That is, the second connection guide surface G3b and the second guide surface G2 are included in the same plane (including substantially the same plane). The continuous surface G3c is provided in which the first connection guide surface G3a and the second connection guide surface G3b are continuous with each other. The continuous surface G3c is a curved surface smoothly connecting the first connection guide surface G3a and the second connection guide surface G3b to each other. Details of the first connection guide surface G3a, the second connection guide surface G3b, and the continuous surface G3c of the connection track R3 will be described below.

As illustrated in FIG. 1 and FIG. 2, the ceiling traveling vehicle 100 includes a main body 10, travelers 20, couplers 30, guiders 40, and a controller 50. The controller 50 collectively controls operations of the respective portions of the ceiling traveling vehicle 100. Although the controller 50 is provided in the main body 10, it may be provided outside the main body 10. The main body 10 is located below (on the −Z side of) the track R. The main body 10 has a rectangular or substantially rectangular shape, for example, in a plan view. The main body 10 is provided in dimensions housed in one cell C in the track R in a plan view. Thus, a space in which one ceiling traveling vehicle 100 passes another ceiling traveling vehicle 100 traveling along an adjacent first track R1 or second track R2 is provided. The main body 10 includes an upper structure 17 and a transfer apparatus 18. The upper structure 17 is hung on the travelers 20 via the couplers 30. The upper structure 17 is rectangular or substantially rectangular in a plan view, for example, and includes four corner portions 10a in an upper surface 17a.

The main body 10 includes the traveling wheel 21, the coupler 30, a direction changer 34, and a guider 40 at each of the four corner portions 10a. The traveling wheels 21 located at the four respective corner portions 10a of the main body 10 are able to stably hang the main body 10 and are able to provide stable travel of the main body 10. The guiders 40 located at the four respective corner portions 10a of the main body 10 are able to effectively prevent the positional deviation of the main body 10 in the first direction D1 or the second direction D2 with respect to the track R and the positional deviation of the main body 10 about the perpendicular axis with respect to the track R. Details of the guider 40 will be described below.

The transfer apparatus 18 is provided below the upper structure 17. The transfer apparatus 18 is able to rotate about a rotation axis AX1 in the Z direction (a vertical direction). The transfer apparatus 18 includes an article holder 13 to hold the article M, a hoisting-and-lowering driver 14 to hoist and lower the article holder 13 in the vertical direction, a lateral mover to slidingly move the hoisting-and-lowering driver 14 in a horizontal direction, and a rotator 12 to hold the lateral mover 11. The article holder 13 grasps a flange portion Ma of the article M to hang and hold the article M. The article holder 13 is a chuck including a horizontally movable hook portion 13a, for example, and the hook portion 13a enters below the flange portion Ma of the article M, and the hook portion 13a hoists the article holder 13 to hold the article M. The article holder 13 is connected to a hanging arm 13b, for example, a wire or a belt.

The hoisting-and-lowering driver 14 is a hoist, for example, and draws out the hanging arm 13b to lower the article holder 13, and winds up the hanging arm 13b to hoist the article holder 13. The hoisting-and-lowering driver 14 is controlled by the controller 50 to lower or hoist the article holder 13 at a certain speed. The hoisting-and-lowering driver 14 is controlled by the controller 50 to hold the article holder 13 at a target height.

The lateral mover 11 includes a plurality of movable plates stacked and located in the Z direction, for example. The movable plates are relatively movable in the Y direction. The hoisting-and-lowering driver 14 is mounted on a lowermost movable plate. The lateral mover 11 moves the movable plates by a drive apparatus (not illustrated) and thus is able to laterally move (slidingly move) the hoisting-and-lowering driver 14 mounted on the lowermost movable plate and the article holder 13 in the horizontal direction orthogonal or substantially orthogonal to the traveling direction, for example.

The rotator 12 is provided between the lateral mover 11 and the upper structure 17. The rotator 12 includes a rotating structure 12a and a rotational driver 12b. The rotating structure 12a is provided rotatably in a direction about an axis in the vertical direction. The rotating structure 12a supports the lateral mover 11. The rotational driver 12b, which is implemented by an electric motor or the like, rotates the rotating structure 12a in a direction about the rotation axis AX1. The rotator 12 rotates the rotating structure 12a through a driving force from the rotational driver 12b and thus rotate is able to the lateral mover 11 (the hoisting-and-lowering driver 14 and the article holder 13) in the direction about the rotation axis AX1.

As illustrated in FIG. 1 and FIG. 2, a cover W may surround the transfer apparatus 18 and the article M held by the transfer apparatus 18. The cover W has a tubular shape with a lower end open with a portion through which the movable plates of the lateral mover 11 protrude notched. The cover W, the upper end of which is mounted on the rotating structure 12a of the rotator 12, rotates about an axis of the rotation axis AX1 along with the rotation of the rotating structure 12a.

A traveler 20 includes the traveling wheel 21 and auxiliary wheels 22. The traveling wheels 21 are located at the four respective corner portions 10a of the upper surface 17a of the upper structure 17 (the main body 10). Each of the traveling wheels 21 is mounted on a wheel shaft 21a provided in the coupler 30. The wheel shaft 21a is provided parallel or substantially parallel to the XY plane. Each of the traveling wheels 21 is rotationally driven by the driving force of a traveling driver 33 described below. Each of the traveling wheels 21 rolls on the traveling surfaces R1a, R2a, and R3a of the first track R1, the second track R2, and the connection track R3, respectively, in the track R, and thus the ceiling traveling vehicle 100 is able to travel. Without being limited to rotationally driving all of the four traveling wheels 21 by the driving force of the traveling driver 33, some of the four traveling wheels 21 may be rotationally driven.

The traveling wheel 21 is turnable in the θZ direction about a turning axis AX2. The traveling wheel 21 turns in the θZ direction by the direction changer 34 described below and is able to change the traveling direction of the ceiling traveling vehicle 100. The auxiliary wheels 22 are located with one each on the front and rear in the traveling direction of the traveling wheel 21. Each of the auxiliary wheels 22, like the traveling wheel 21, is rotatable about an axis of a wheel shaft 22a parallel or substantially parallel to the XY plane. A lower end of the auxiliary wheels 22 is higher than a lower end of the traveling wheel 21. Accordingly, when the traveling wheel 21 is traveling on the traveling surfaces R1a, R2a, and R3a, the auxiliary wheels 22 are not in contact with the traveling surface R1a, R2a, or R3a. When the traveling wheel 21 passes through the gap D, the auxiliary wheels 22 come into contact with the traveling surfaces R1a, R2a, and R3a to prevent the traveling wheel 21 from falling. Without being limited to providing two auxiliary wheels 22 for one traveling wheel 21, one auxiliary wheel 22 may be provided for one traveling wheel 21, or no auxiliary wheels 22 may be provided, for example.

The couplers 30 couple the upper structure 17 of the main body 10 and the travelers 20 to each other. The couplers 30 are provided at the four respective corner portions 10a of the upper surface 17a of the upper structure 17 (the main body 10). The main body 10 is hung from the travelers 20 by the couplers 30 located below the track R. The coupler 30 includes a support 31 and a connector 32. The support 31 rotatably supports a rotation axis of the traveling wheel 21 and rotation axes of the auxiliary wheels 22. The support 31 holds a relative position among the traveling wheel 21 and the auxiliary wheels 22. The support 31 has a plate shape, for example, and is provided with a thickness that is able to pass through the gap D.

The connector 32 extends downward from the support 31 to be coupled to the upper surface 17a of the upper structure 17 and to hold the upper structure 17. The connector 32 includes a transmitter to transmit the driving force of the traveling driver described below to the drive wheel 21 therewithin. The transmitter may be implemented by a chain, a belt, a gear train, or the like. The connector 32 is turnable in the θZ direction about the turning axis AX2. The connector 32 turns about the turning axis AX2, and the traveling wheel 21 is able to turn in the θZ direction about the turning axis AX2 via the support 31.

The coupler 30 is provided with the traveling driver 33 and the direction changer 34. The traveling driver 33 is mounted on the connector 32. The traveling driver 33 is a driving source to drive the traveling wheel 21, and may include an electric motor or the like, for example. The four traveling wheels 21 are each driven by the traveling driver 33 to be drive wheels. The four traveling wheels 21 are controlled by the controller 50 to have the same or substantially the same number of rotations. When any of the four traveling wheels 21 is not implemented as a drive wheel, the traveling driver 33 is not mounted on the connector 32 corresponding to the traveling wheel 21 not implemented as a drive wheel.

The direction changer 34 turns the connector 32 of the coupler 30 about the turning axis AX2 to turn the traveling wheels 21 in the θZ direction about the turning axis AX2. The traveling wheel 21 is turned in the θZ direction, and thus the first state, in which the traveling direction of the ceiling traveling vehicle 100 is the first direction D1, is able to be switched to the second state, in which the traveling direction thereof is the second direction D2, or the second state, in which the traveling direction thereof is the second direction D2, is able to be switched to the first state, in which the traveling direction thereof is the first direction D1.

The direction changer 34 includes a driving source 35, a pinion gear 36, and a rack 37. The driving source 35 is mounted on a side surface of the traveling driver 33 away from the turning axis AX2. The driving source 35 may be implemented by an electric motor or the like. The pinion gear 36 is mounted on a lower surface side of the driving source 35 and is rotationally driven in the θZ direction through a driving force generated by the driving source 35. The pinion gear 36 is circular in a plan view and has a plurality of teeth in a circumferential direction on its perimeter. The rack 37 is fixed to the upper surface 17a of the upper structure 17. Racks 37 are provided at the four respective corner portions 10a of the upper surface 17a of the upper structure 17 and are each provided in an arc shape (a fan shape) about the turning axis AX2 of the traveling wheel 21. The rack 37 has a plurality of teeth meshing with the teeth of the pinion gear 36 in a circumferential direction on its perimeter.

The pinion gear 36 and the rack 37 are located with the mutual teeth meshing with each other. The pinion gear 36 rotates in the θZ direction, and thus the pinion gear 36 moves in a circumferential direction about the turning axis AX2 to follow the perimeter of the rack 37. With this movement of the pinion gear 36, the connector 32 turns, and the traveling driver 33 and the direction changer 34 turn in the circumferential direction about the turning axis AX2 together with the pinion gear 36.

By the turning of the direction changer 34, the traveling wheels 21 and the auxiliary wheels 22 located at the four respective corner portions 10a of the upper surface 17a each turn in a range of 90 degrees in the θZ direction about the turning axis AX2. The drive of the direction changer 34 is controlled by the controller 50. The controller 50 may instruct to perform turning operations of the four traveling wheels 21 at the same time or instruct to perform them at different times. The traveling wheels 21 and the auxiliary wheels 22 are turned, and thus a state in which the traveling wheels 21 are in contact with one of the first track R1 and the second track R2 shifts to a state in which the traveling wheels 21 are in contact with the other. In other words, a state in which the direction of the rotation axis of the traveling wheel 21 is one of the first direction D1 and the second direction D2 shifts to a state in which the direction of the rotation axis of the traveling wheel 21 is the other. Thus, the first state, in which the traveling direction of the ceiling traveling vehicle 100 is the first direction D1 (the X direction), and the second state, in which the traveling direction thereof is the second direction D2 (the Y direction), are able to switch to each other.

Figure 4A:
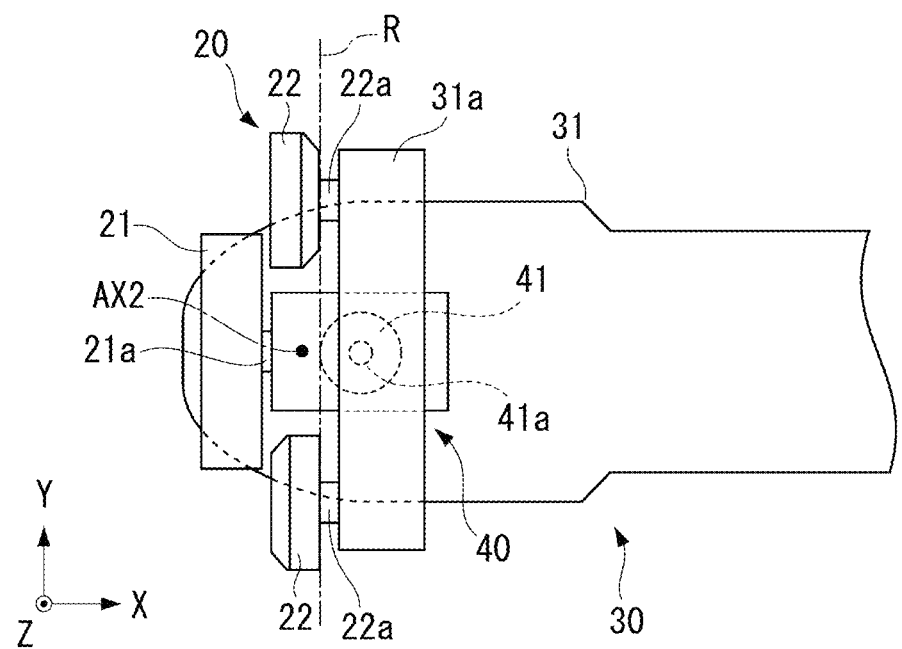
FIGS. 4A and 4B illustrate a plan view and a front elevational view of a traveler and a coupler of the ceiling traveling vehicle.
Figure 4B:
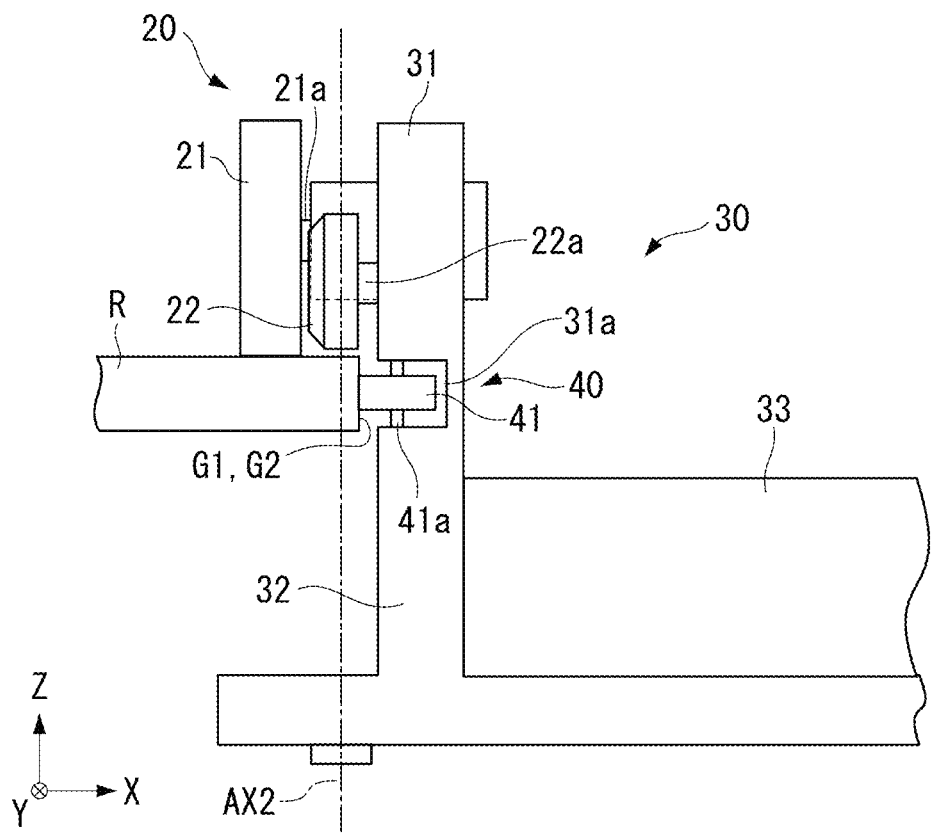

FIGS. 4A and 4B is a diagram illustrating an example of the traveler 20 and the coupler 30: FIG. 4A is a plan view; and FIG. 4B is a front elevational view. As illustrated in FIGS. 4A and 4B, the support 31 of the coupler 30 is provided with a guider container 31a. The guider 40 prevents the positional deviation of the coupler 30 with respect to the track R and thus prevents the positional deviation of the main body 10 with respect to the track R. The guider 40 is provided in each of the couplers 30 located at the four respective corner portions 10a of the upper surface 17a of the main body 10 (refer to FIG. 1 and FIG. 2). The guider 40 moves along the first guide surface G1 and the first connection guide surface G3a in the first state, in which the traveling wheel 21 travels along the first track R1. The guider 40 moves along the second guide surface G2 and the second connection guide surface G3b in the second state, in which the traveling wheel 21 travels along the second track R2. While the main body 10 is traveling, the guider 40 may be in contact with the first guide surface G1 or the second guide surface G2 or be spaced away from the first guide surface G1 or the second guide surface G2.

The guider 40 includes a guide roller 41 contained in the guider container 31a of the support 31. The guide roller 41 is contained in the guider container 31a and is located with an end on the −X side protruding from the guider container 31a. The guide roller 41 is rotatably supported about the Z axis by a roller shaft 41a. The roller shaft 41a is fixed to the inside of the guider container 31a and is located in parallel or substantially in parallel to the Z direction.

The roller shaft 41a may be supported by an elastic component or element, for example. Accordingly, the guide roller 41 is supported movably in the X direction and rotatably, and the impact of the guide roller 41 hitting the first guide surface G1 or the like is able to be absorbed by the elastic component or element. The guide roller 41 is a driven roller having no driving source rotating the guide roller 41. However, a driver rotationally driving the guide roller 41 in accordance with a traveling direction of the main body 10 may be included.

The guide roller 41 is located at a height between the wheel shaft 21a of the traveling wheel 21 and the main body 10. The first guide surface G1 and the second guide surface G2 are located at a height between the wheel shaft 21a of the traveling wheel 21 and the main body 10. The guide roller 41 is located at a position corresponding to the height of the first guide surface G1 and the second guide surface G2 in the coupler 30. The guide roller 41 is located at the height between the wheel shaft 21a of the traveling wheel 21 and the main body 10, and thus the dimension of the coupler 30 or the traveler 20 in an up-and-down direction is prevented from increasing, and a reduction in space efficiency near a ceiling of a building or the like is prevented.

The roller shaft 41a is provided in the coupler 30, and thus when the orientation of the traveling wheel 21 is changed by the direction changer 34, that is, when the coupler 30 is turned by the direction changer 34, the guider 40 (the guide roller 41) turns about the turning axis AX2 together with the turning of the traveling wheel 21. Accordingly, in the first state, in which the traveling wheel 21 travels along the first track R1, the guide roller 41 faces the first guide surface G1 and the first connection guide surface G3a, and in the second state, in which the traveling wheel 21 travels along the second track R2, the guide roller 41 faces the second guide surface G2 and the second connection guide surface G3b. Thus, the guide roller 41 is turned by the direction changer 34 to switch a traveling state of the traveling wheel 21, and thus there is no need to provide a separate mechanism in order to turn the guide roller 41, thus preventing the features of the main body 10 from being complicated.

Figure 5:
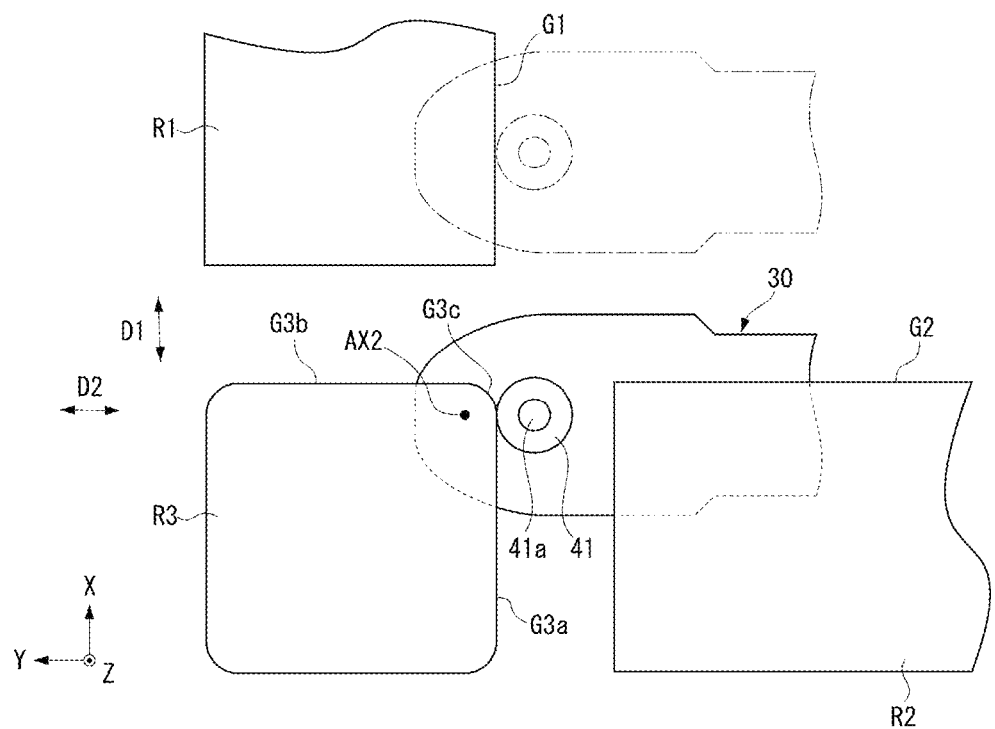
FIG. 5 is a plan view illustrating an example of a positional relation among a first track, a second track, a connection track, and a guider.
Figure 6:
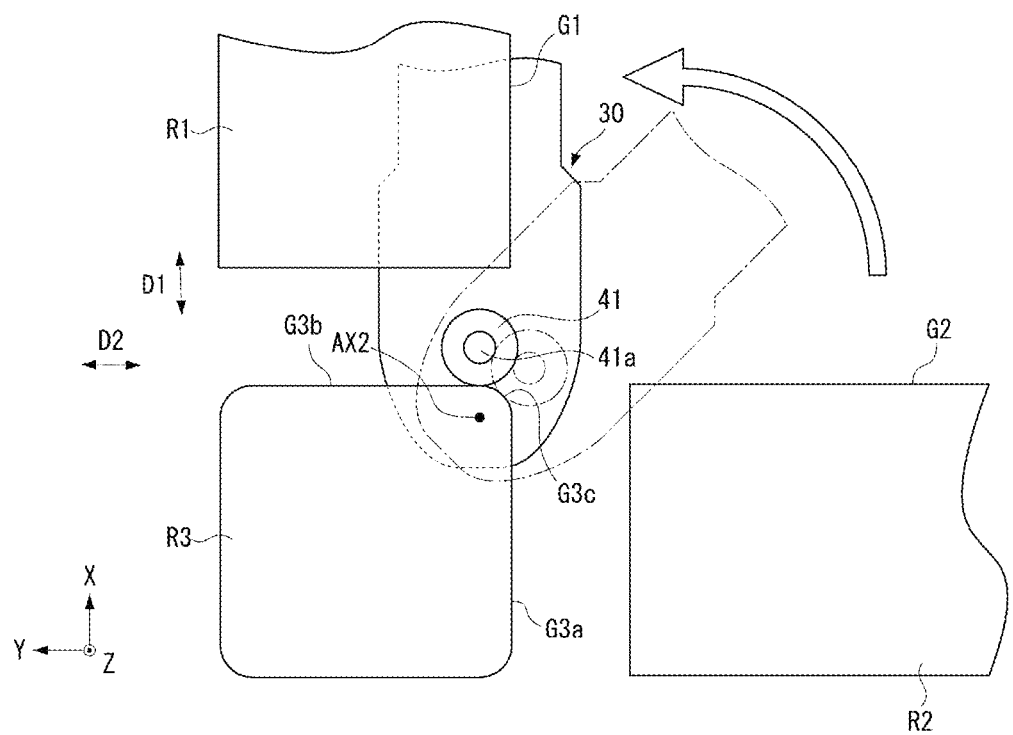
FIG. 6 is a plan view illustrating an example of the guider when a traveling wheel is turned.

FIG. 5 is a plan view illustrating an example of a positional relation among the first track R1, the second track R2, the connection track R3, and the guide roller 41. FIG. 6 is a plan view illustrating an example of the guider 40 (the guide roller 41) when the traveling wheel 21 is turned. As illustrated in FIG. 5 and FIG. 6, a portion of the guide roller 41 protruding from the guider container 31a of the support 31 is able to be in contact with the first guide surface G1 as the side surface of the first track R1, the second guide surface G2 as the side surface of the second track R2, the first connection guide surface G3a, the second connection guide surface G3b, and the continuous surface G3c as the side surfaces of the connection track R3. In FIG. 5 and FIG. 6, the representation of the guider container 31a of the support 31 is omitted.

As illustrated in FIG. 5, when the main body 10 travels in the first direction D1 (in the first state, in which the traveling wheel 21 rolls on the first track R1), the guide roller 41 moves along the first guide surface G1 or the first connection guide surface G3a. In this first state, the portion of the guide roller 41 protruding from the guider container 31a is able to be in contact with the first guide surface G1 and the first connection guide surface G3a. The guide roller 41 is able to rotate when contacting the first guide surface G1 and the first connection guide surface G3a, thus reducing frictional resistance during contact while the main body 10 is traveling and preventing a load on the traveling driver 33 from increasing while reducing the generation of particles.

When the main body 10 moves in the second direction D2 in the state illustrated in FIG. 5, the guide roller 41 comes into contact with the first guide surface G1 or the first connection guide surface G3*a*, and thus the positional deviation of the main body 10 in the second direction D2 is limited. That is, the main body 10 includes a pair of guide rollers 41 in the second direction D2, and the guide rollers 41 come into contact with the first guide surface G1 or the first connection guide surface G3*a* faced by the guide rollers 41, and thus the positional deviation of the main body 10 in the +Y direction and the −Y direction is prevented. Accordingly, positional deviation in the second direction D2 is limited even when the main body 10 is stationary at any portion of the track R, not to mention while the main body 10 is traveling in the first direction D1.

As illustrated in FIG. 6, when the main body 10 travels along the second direction D2 from the state in which the main body 10 is traveling in the first direction D1 (in the case of the second state, in which the traveling wheel 21 rolls on the second track R2), the traveling wheel 21 is turned by the direction changer 34. In this process, the coupler 30 is turned by the direction changer 34, and thus the guide roller 41 also turns about the turning axis AX2. The guide roller 41 moves from the first connection guide surface G3*a* to the second connection guide surface G3*b* via the continuous surface G3*c*.

The continuous surface G3*c* is a curved surface smoothly connecting the first connection guide surface G3*a* and the second connection guide surface G3*b* to each other, and thus the guide roller 41 is able to be smoothly moved while being rotated. In the present preferred embodiment, the continuous surface G3*c* is provided in an arc shape in a plan view, and thus the movement of the guide roller 41 is able to be performed more smoothly. The shape of the continuous surface G3*c* is not limited to the illustrated shape, may be a curved surface other than the arc shape in a plan view, or may be a non-smooth shape including a plurality of planes connected to define corner portions, for example.

The continuous surface G3*c* need not be provided. That is, the first connection guide surface G3*a* and the second connection guide surface G3*b* are separate from each other, for example; thus, the two need not be continuous with each other. When moving from the first connection guide surface G3*a* to the second connection guide surface G3*b* or when moving from the second connection guide surface G3*b* to the first connection guide surface G3*a*, the guide roller 41 temporarily becomes noncontact with these guide surfaces.

As illustrated in FIG. 6, the guide roller 41 moves to a state along the second connection guide surface G3*b*, and thus the main body 10 becomes a state in which the main body 10 is able to travel along the second direction D2 (the second state, in which the traveling wheel 21 rolls on the second track R2). In this second state, the portion of the guide roller 41 protruding from the guider container 31*a* is able to be in contact with the second guide surface G2 and the second connection guide surface G3*b*. Similar to the above, the guide roller 41 is able to rotate when contacting the second guide surface G2 and the second connection guide surface G3*b*, thus reducing frictional resistance during contact while the main body 10 is traveling and preventing a load on the traveling driver 33 from increasing.

When the main body 10 moves in the first direction D1 in the state illustrated in FIG. 6, the guide roller 41 comes into contact with the second guide surface G2 or the second connection guide surface G3*b*, and thus the positional deviation of the main body 10 in the first direction D1 is limited. That is, the main body 10 has a pair of guide rollers 41 in the first direction D1, and the guide rollers 41 come into contact with the second guide surface G2 or the second connection guide surface G3*b* faced by the guide rollers 41, and thus the positional deviation of the main body 10 in the +X direction and the −X direction is prevented. Accordingly, positional direction in the first direction D1 is limited even when the main body 10 is stationary at any portion of the track R, not to mention while the main body 10 is traveling in the second direction D2.

Figure 7:
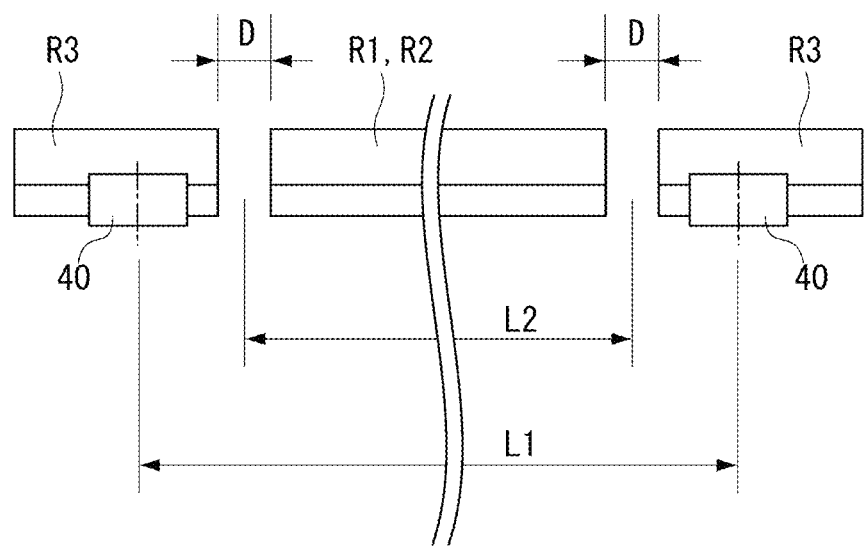
FIG. 7 is a side view illustrating a positional relation between two gaps and two guiders.

FIG. 7 is a side view illustrating an example of a positional relation between the track R and the guide roller 41. As illustrated in FIG. 7, a spacing L1 between two guide rollers 41 provided in the traveling direction among the four guide rollers 41 is set to be different from a spacing L2 of gaps D adjacent to each other in the first direction D1 or the second direction D2. Accordingly, the two guide rollers 41 provided in the traveling direction are prevented from being simultaneously positioned at the gaps D. Although the example illustrated in FIG. 7 illustrates a case in which the spacing L1 of the guide rollers 41 is larger than the spacing L2 of the gaps D, this implementation is not limiting; the spacing L1 of the guide rollers 41 may be smaller than the spacing L2 of the gaps D.

Figure 8:
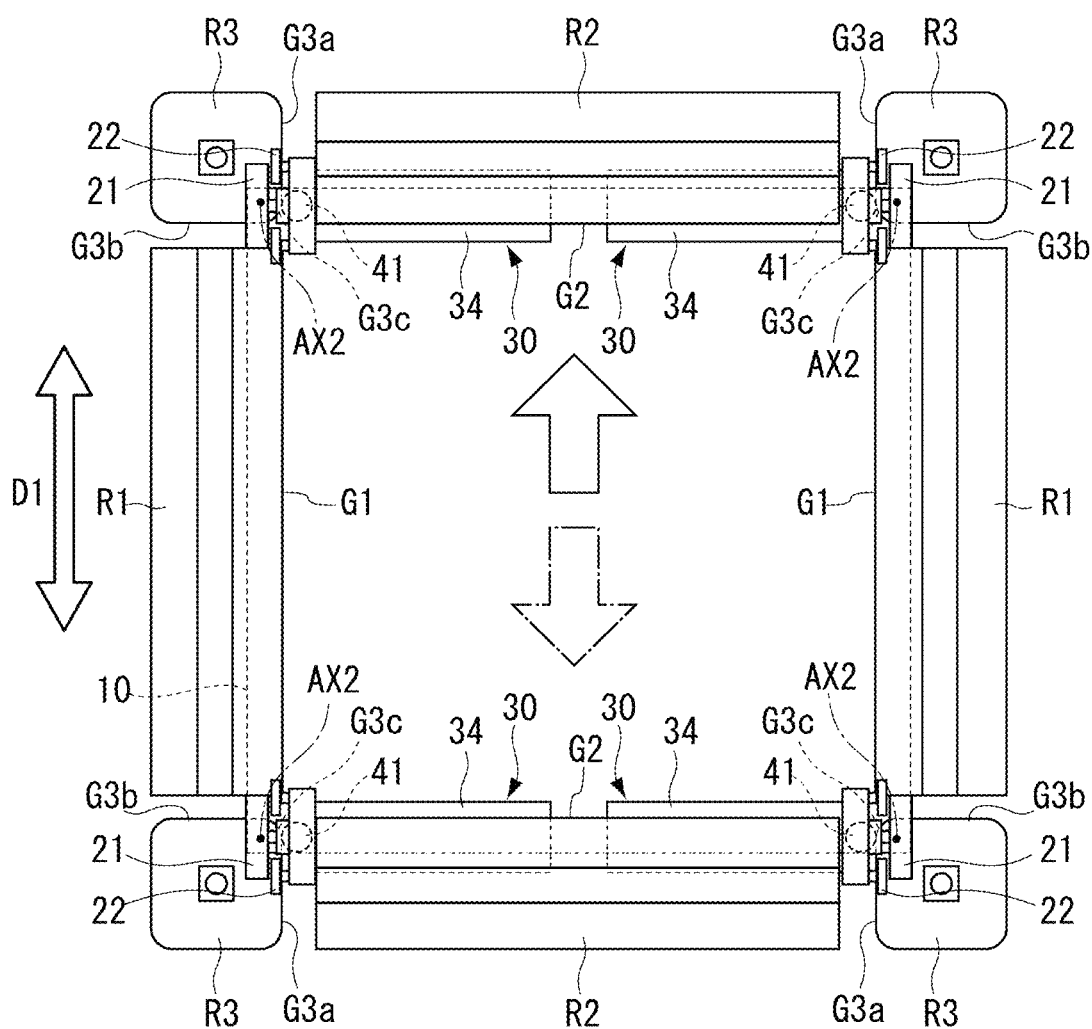
FIG. 8 is a diagram illustrating a state in which a traveling direction of the ceiling traveling vehicle is a first direction.

The following describes a case in which the ceiling traveling vehicle 100 changes its traveling direction in the traveling vehicle system SYS according to the present preferred embodiment. FIG. 8 to FIG. 11 are diagrams illustrating an operation to change the traveling direction of the ceiling traveling vehicle 100 from the first direction D1 to the second direction D2. As illustrated in FIG. 8, the ceiling traveling vehicle 100 stops at a position at which the main body 10 traveling along the first track R1 in the first direction D1 (the +X direction or the −X direction) has reached one cell C (refer to FIG. 3) of the track R (a position at which the four corner portions 10*a* have approached respective connection tracks R3). That is, the controller 50 (refer to FIG. 1) stops the drive of the traveling driver 33 at the position described above. At this moment, all the four traveling wheels 21 are in contact with the respective connection tracks R3. The four guide rollers 41 are each located at a position along the first connection guide surface G3*a* of the connection track R3.

Figure 9:
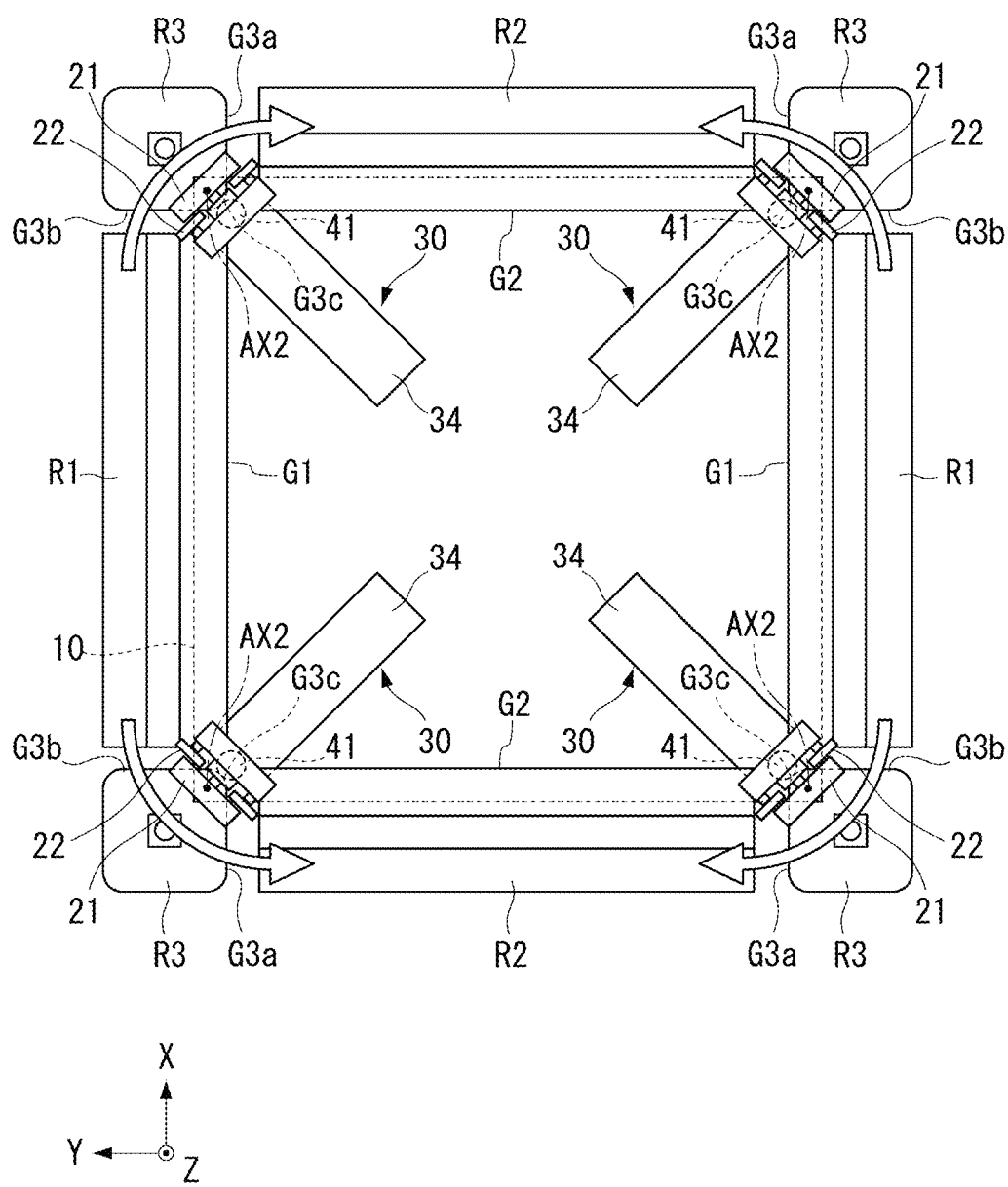
FIG. 9 is a diagram illustrating an operation to change the traveling direction of the ceiling traveling vehicle from a second direction to the first direction.

Next, as illustrated in FIG. 9, the controller 50 drives the direction changer 34 to turn the couplers 30 and to turn the traveling wheels 21 and the auxiliary wheels 22 located at the four respective corner portions 10*a* in the θZ direction about the turning axis AX2. In this process, the traveling wheels 21 and the like that are diagonally located turn in the same direction. Among the four traveling wheels 21, the upper left traveling wheel 21 and the like and the lower right traveling wheel 21 and the like in the drawing turn clockwise, for example. On the other hand, the upper right traveling wheel 21 and the like and the lower left traveling wheel 21 and the like in the drawing turn counterclockwise. Turning operations may be performed at the same time or performed at different times, for example, the upper left and lower right traveling wheels 21 and the like in the drawing may be turned first simultaneously, and then the upper right and lower left traveling wheels 21 and the like in the drawing may be turned simultaneously.

During the turning of the traveling wheels 21 and the auxiliary wheels 22, the four guide rollers 41 each turn about the turning axis AX2 integrally with the respective couplers 30 and move along the continuous surface G3*c*. Accordingly, the guide rollers 41 turn to switch their directions simultaneously with the turning of the traveling wheels 21 and the auxiliary wheels 22. The guide rollers 41 move along respective continuous surfaces G3*c*, thus providing smooth movement of the guide rollers 41. The turning of the guide rollers 41 do not hinder the turning operations of the traveling wheels 21 and the like. The turning of the traveling wheels 21 and the like and the turning of the guide rollers 41 are performed by common respective direction changers 34, and thus there is no need to separately provide a structure to change the directions of the guide rollers 41, thus preventing the features of the main body 10 from being complicated.

Figure 10:
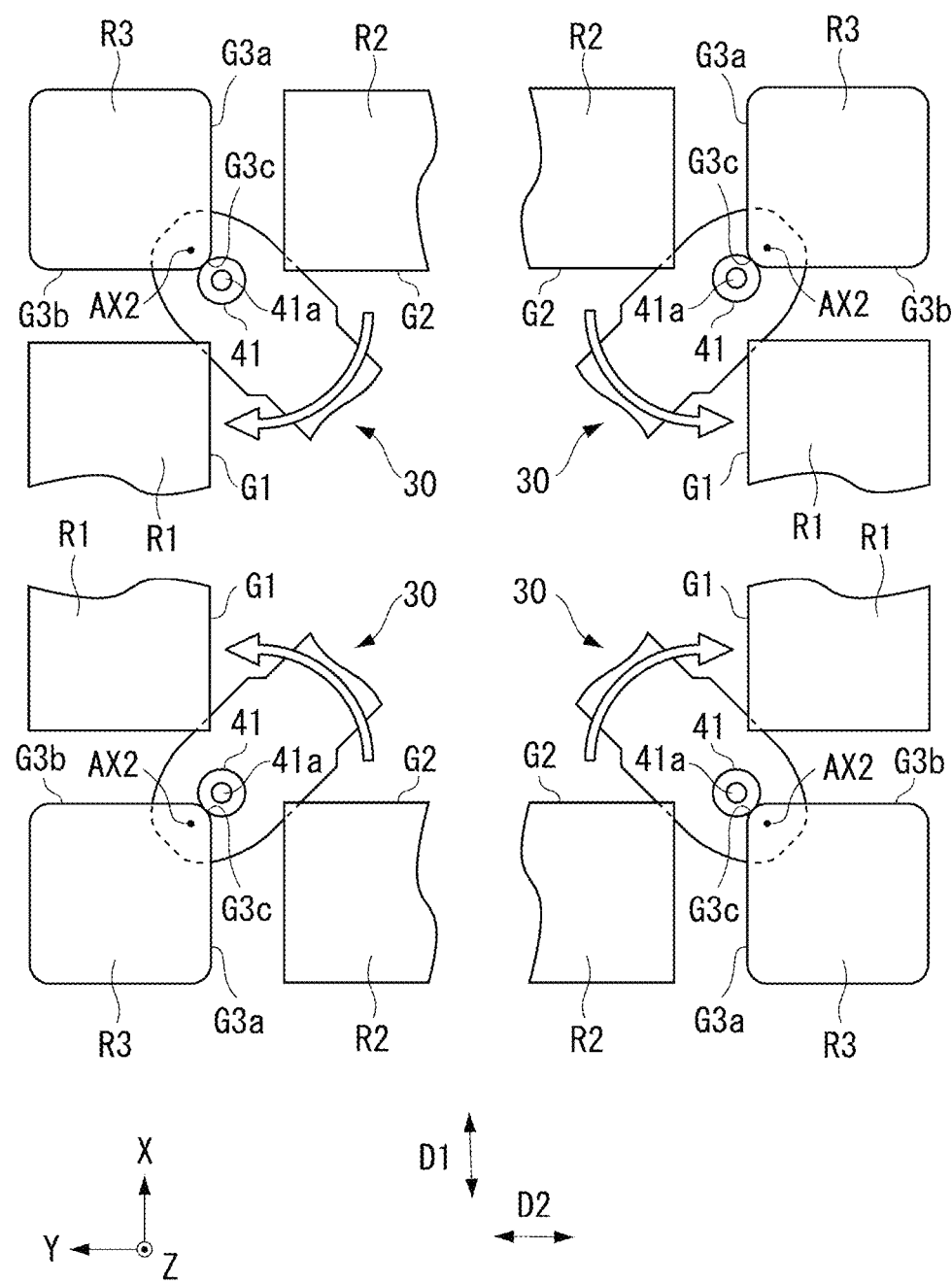
FIG. 10 is a diagram illustrating guide rollers during the turning of traveling wheels.

FIG. 10 is a diagram illustrating the guide rollers 41 during the turning of the traveling wheels 21. As illustrated in FIG. 10, the turning operations of the four traveling wheels 21 are performed at the same time, and thus the four guide rollers 41 provided in the respective couplers 30 synchronously change their orientations. Accordingly, during the turning operation (during steering) of the traveling wheels 21, the guide rollers 41 face the respective connection tracks R3 (continuous surfaces G3*c*), and thus the positional deviation of the main body 10 is prevented. During the turning operations of the traveling wheels 21, the guide rollers 41 move along the respective continuous surfaces G3*c*, and thus the positional deviation of the main body 10 is able to be prevented during the turning operations of the traveling wheels 21.

Figure 11:
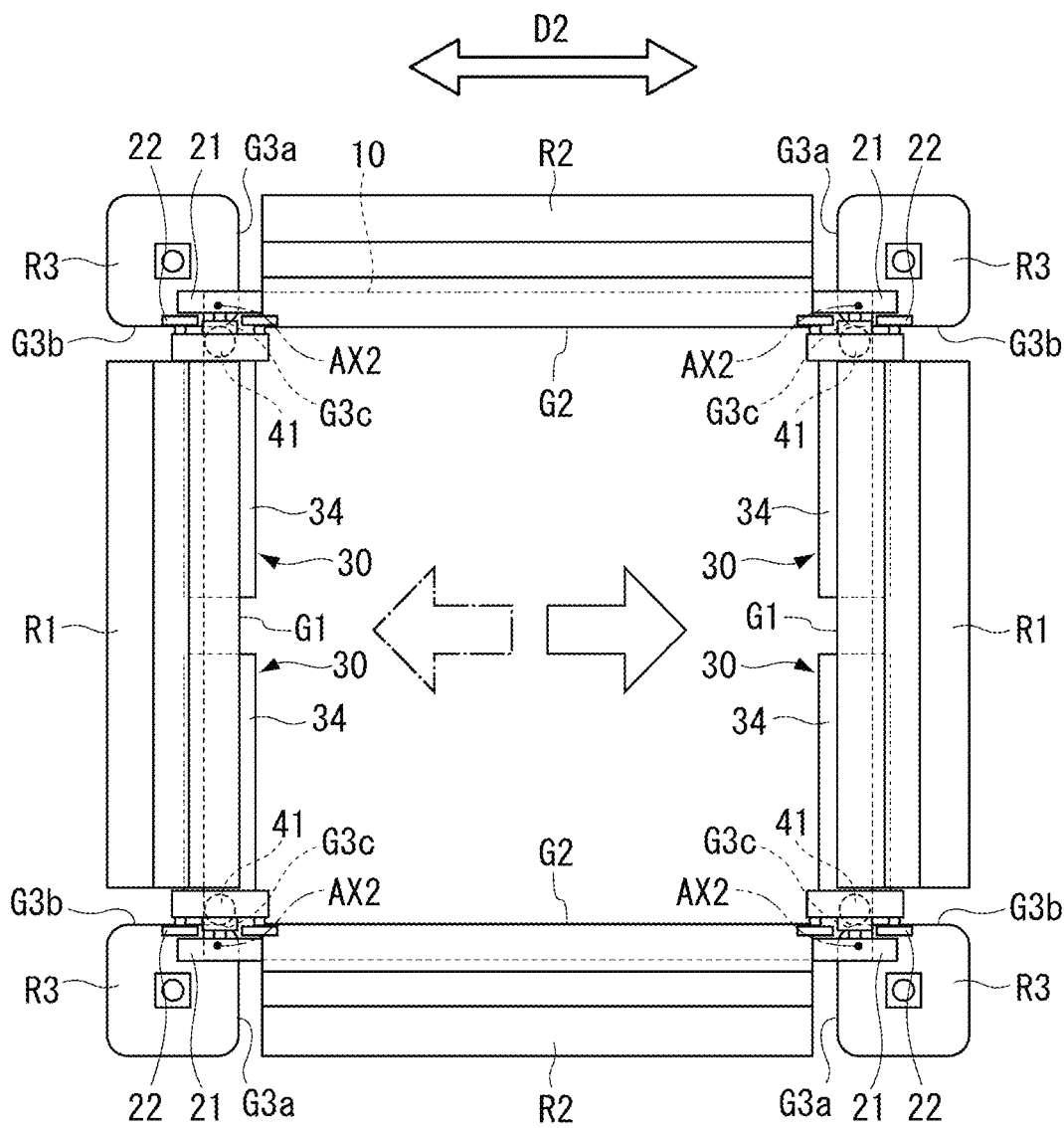
FIG. 11 is a diagram illustrating a state in which the traveling direction of the ceiling traveling vehicle is the second direction.

Next, as illustrated in FIG. 11, after the traveling wheels 21 and the like have each turned by 90° in the θZ direction, the controller 50 stops the drive of the direction changers 34. The traveling driver 33 is driven in this state, and thus the ceiling traveling vehicle 100 becomes able to travel in the second direction D2 (the +Y direction or the −Y direction). The four guide rollers 41 are each located at a position along the second connection guide surface G3*b* of the connection track R3. Even when the traveling wheels 21 and the like turn, the main body 10 does not turn. Accordingly, in either case when the ceiling traveling vehicle 100 travels in the first direction D1 or when the ceiling traveling vehicle 100 travels in the second direction D2, the orientation of the main body 10 remains unchanged.

Thus, with the traveling vehicle system SYS according to the present preferred embodiment, the guide roller 41 of the guider 40 rotates integrally with the coupler 30, and thus without any separate structure to change the direction of the guide roller 41, the direction of the guide roller 41 is able to be switched in accordance with the direction change of the traveling wheel 21. Accordingly, the positional deviation of the main body 10 is able to be prevented by a simple implementation while avoiding the features of the ceiling traveling vehicle 100 from being complicated. Although FIG. 8 to FIG. 11 illustrate a case in which the ceiling traveling vehicle 100 changes its traveling direction from the first direction D1 to the second direction D2, the same or similar features apply to a case in which the ceiling traveling vehicle 100 changes its traveling direction from the second direction D2 to the first direction D1.

Although the preferred embodiments describes an example in which the first guide surface G1 and the second guide surface G2 are the side surface of the first track R1 and the side surface of the second track R2 as an example, respectively, this example is not limiting.

Figure 12:
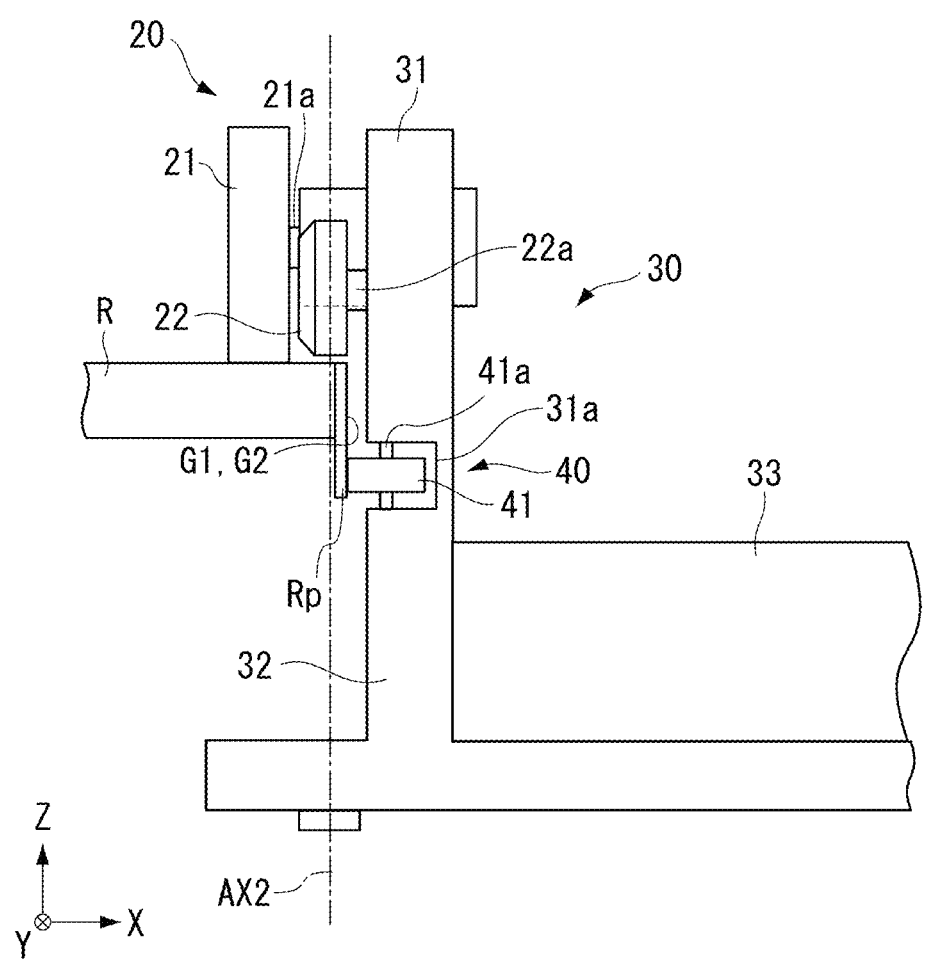
FIG. 12 is a diagram illustrating another example of the guider and a first guide surface or a second guide surface.

FIG. 12 is a diagram illustrating another example of the track R, the traveler 20, and the coupler 30. As illustrated in FIG. 12, a guide plate Rp may be mounted on the side surfaces of the first track R1 and the second track R2 out of the track R, and a surface of the guide plate Rp may be the first guide surface G1 or the second guide surface G2. The guide plate Rp is located extending downward (the −Z side) from the side surfaces of the first track R1 and the second track R2. Accordingly, the first guide surface G1 and the second guide surface G2 are able to be set below the first track R1 and the second track R2. Also in the connection track R3, a guide plate (not illustrated) extending downward from the side surfaces of the track is mounted to provide the first connection guide surface G3*a*, the second connection guide surface G3*b*, and the continuous surface G3*c*.

As shown in FIG. 12, the position of the guide roller 41 in a height direction is determined along the first guide surface G1 and the second guide surface G2 (including the first connection guide surface G3*a*, the second connection guide surface G3*b*, and the continuous surface G3*c* not illustrated). Accordingly, the guide roller 41 is located below the first track R1 and the second track R2. The first guide surface G1 and the like are not limited to being located below the first track R1 and the like. The guide plate Rp may be located above the first track R1 and the like, for example. The guide plate Rp may be held by the first track R1 and the like via a support or the like.

Although the preferred embodiments have been described, the present invention is not limited to the description described above, and various modifications may be implemented without departing from the gist and scope of the present invention. Although the preferred embodiments relate to examples in which the guiders 40 are located at the four respective couplers 30, these examples are not limiting. The guiders 40 may be located at any one to three of the four couplers 30, for example.

Although the preferred embodiments relate to examples in which the guide roller 41 rotating about an axis of the roller shaft 41*a* is provided as the guider 40, this is not limiting. The guider 40 may be non-rotating, for example, a protruding portion provided on the support 31 of the coupler 30. The protruding portion may be defined by a protrusion provided in a spherical or curved surface shape, or by a shape that reduces frictional resistance with the first guide surface G1 and the like. The guider 40 may be located with a certain spacing provided with respect to each of the first guide surface G1, the second guide surface G2, the first connection guide surface G3*a*, the second connection guide surface G3*b*, and the continuous surface G3*c*.

Although the preferred embodiments include a track R in which the first track R1 (the first direction D1) and the second track R2 (the second direction D2) are orthogonal or substantially orthogonal to each other as an example, this is not limiting. According to another example of the track R, the first track R1 and the second track R2 are not orthogonal to each other, for example. Without being limited to the track R in which the first track R1 and the second track R2 cross each other, the track R may have a structure in which the second track R2 is bent from an end of the first track R1, for example.

One or more of the features described in the preferred embodiments, modifications thereof, and the like described above may be omitted. The features described in the preferred embodiments, modifications thereof, and the like described above are able to be combined with each other as appropriate. To the extent permitted by law, the entire disclosure of Japanese Patent Application No. 2018-222552 as a Japanese patent application and all the literature cited in the preferred embodiments and the like described above are hereby incorporated herein by reference.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. A traveling vehicle system comprising:
a track including a first track extending along a first direction, a second track extending along a second direction different from the first direction, and a connection track adjacent to the first track in the first direction, adjacent to the second track in the second direction, and located with a gap with respect to each of the first track and the second track; and
a ceiling traveling vehicle to travel along the track; wherein
the track includes:
a first guide surface provided along the first track; and
a second guide surface provided along the second track;
the ceiling traveling vehicle includes:
a traveling wheel to roll on the first track, on the second track, and on the connection track;
a main body located below the track;
a coupler coupling a wheel shaft of the traveling wheel and the main body to each other and passing through the gap when the traveling wheel rolls on the connection track;
a direction changer to switch between a first state in which the traveling wheel rolls on the first track, and a second state in which the traveling wheel rolls on the second track, by turning the coupler about a turning axis with respect to the main body; and
a guider provided in the coupler to move along the first guide surface in the first state and to move along the second guide surface in the second state;
the connection track includes:
a first connection guide surface provided at a same or substantially same height and in a same or substantially same direction as the first guide surface and a second connection guide surface provided at a same or substantially same height and in a same or substantially same direction as the second guide surface; and
a continuous surface in which the first connection guide surface and the second connection guide surface are continuous with each other;
when the guider is turned, a trajectory of the guider is located inside the ceiling traveling vehicle in a plan view with respect to the turning axis;
the guider is turned around the connection track; and
the main body is rectangular or substantially rectangular when viewed in an axial direction of the turning axis of the coupler and includes the traveling wheel, the coupler, the direction changer, and the guider at each of four corner portions.

2. The traveling vehicle system according to claim 1, wherein
the first guide surface includes a side surface of the first track; and
the second guide surface includes a side surface of the second track.

3. The traveling vehicle system according to claim 1, wherein
the guider is located at a height between the wheel shaft of the traveling wheel and the main body; and
the first guide surface and the second guide surface are located at a height between the wheel shaft of the traveling wheel and the main body.

4. The traveling vehicle system according to claim 1, wherein the guider includes a guide roller that is able to roll when contacting the first guide surface or the second guide surface.

5. The traveling vehicle system according to claim 1, wherein a spacing between two of the guiders provided in a traveling direction of the ceiling traveling vehicle is different from a spacing between two of the gaps adjacent to each other in the first direction or the second direction.

* * * * *